(12) United States Patent
Walker et al.

(10) Patent No.: US 7,895,550 B2
(45) Date of Patent: Feb. 22, 2011

(54) ON CHIP LOCAL MOSFET SIZING

(75) Inventors: John Q. Walker, Colorado Springs, CO (US); Jeffrey P. Burleson, Fort Collins, CO (US); Scott A. Service, Belle Plaine, MN (US); Steven L. Howard, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 371 days.

(21) Appl. No.: 12/103,825

(22) Filed: Apr. 16, 2008

(65) Prior Publication Data

US 2009/0265675 A1  Oct. 22, 2009

(51) Int. Cl.
*G06F 17/50* (2006.01)
(52) U.S. Cl. .................. 716/100; 716/101; 716/102; 716/106; 716/110; 703/13; 703/14
(58) Field of Classification Search .................. 716/1–6; 703/13–14
See application file for complete search history.

(56) References Cited

U.S. PATENT DOCUMENTS 6,090,650 A * 7/2000 Dabral et al. ............... 438/195
6,216,099 B1 * 4/2001 Fang et al. .................. 703/15
7,441,211 B1 * 10/2008 Gupta et al. ................. 716/2

* cited by examiner

*Primary Examiner*—Nghia M Doan
(74) *Attorney, Agent, or Firm*—Luedeka, Neely, & Graham, P.C.

(57) ABSTRACT

A method for reducing variation in a desired property between transistors in an integrated circuit that is fabricated with a given process. The process is characterized to form a mathematical model that associates changes in polysilicon density and active density in the integrate circuit with changes in gate length and gate width in the transistors, and associates changes in the gate length and the gate width to the desired property. The integrated circuit is laid out with space sufficient to adjust the gate length and the gate width of the transistors without violating design rules of the transistors. The integrated circuit is divided into portions, and for at least a given one of the portions of the integrated circuit, the polysilicon density and the active density of the given portion is measured. For at least one of the transistors in the given portion of the integrated circuit, at least one of the gate length and the gate width of the transistor is selectively adjusted according to the mathematical model, based on at least one of the polysilicon density and the active density of the given portion, to reduce variation in the desired property between the transistors in the integrated circuit.

20 Claims, 4 Drawing Sheets

ON CHIP LOCAL MOSFET SIZING

FIELD

This invention relates to the field of integrated circuit fabrication. More particularly, this invention relates to reducing the on chip variation in certain properties of integrated circuits.

BACKGROUND

It is simple to say that the physical properties of an individual transistor within an integrated circuit tend to determine the performance of the transistor. However, understanding how these properties—the number of which is virtually infinite—affect the performance of the transistor is another matter altogether. It is an even greater subsequent step to then predict how certain properties will be affected by various processing conditions, and how variations in these effects can be compensated for.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are formed of many layers of different materials, which layers are patterned so as to form desired structures that interact with one another according to predetermined designs. Thus, it is of vital importance that many of these layers be formed to very exacting tolerances, such as in their shape, thickness, and composition. If the various structures so formed during the integrated circuit fabrication process are not precisely formed, then the integrated circuit tends to not function in the intended manner, and may not function at all.

The variations of many important integrated circuit properties are dependant upon many factors that are well known. However, some variations occur in a manner that is seemingly not predictable.

What is needed, therefore, is a better understanding of how to compensate for variations in integrated circuit properties.

SUMMARY

The above and other needs are met by a method for reducing variation in a desired property between transistors in an integrated circuit that is fabricated with a given process. The process is characterized to form a mathematical model that associates changes in polysilicon density and active density in the integrate circuit with changes in gate length and gate width in the transistors, and associates changes in the gate length and the gate width to the desired property. The integrated circuit is laid out with space sufficient to adjust the gate length and the gate width of the transistors without violating design rules of the transistors. The integrated circuit is divided into portions, and for at least a given one of the portions of the integrated circuit, the polysilicon density and the active density of the given portion is measured. For at least one of the transistors in the given portion of the integrated circuit, at least one of the gate length and the gate width of the transistor is selectively adjusted according to the mathematical model, based on at least one of the polysilicon density and the active density of the given portion, to reduce variation in the desired property between the transistors in the integrated circuit.

In this manner, the property of the transistors is adjusted according the characterized process model to reduce the variation in the property from transistor to transistor, based on the polysilicon density and the active density of the defined portion. Thus, the method produces completed integrated circuits that have a generally reduced on-chip variation, based on the novel relationships as described herein.

In various embodiments, the desired property of the transistors is an electrical property, which in some embodiments includes at least one of current density and voltage threshold. The polysilicon density and the active density are measured for all portions of the integrated circuit in some embodiments. In some embodiments, at least one of the gate length and the gate width is adjusted for all of the transistors in the at least one portion. In some embodiments, the gate width is adjusted before adjusting the gate length, and if the variation is reduced to a desired degree by the adjustment to the gate width, then the gate length is not adjusted. In some embodiments at least one of the gate width and the gate length is adjusted if the adjustment does not violate the design rules. In some embodiments the gate length is adjusted before adjusting the gate width, and if the variation is reduced to a desired degree by the adjustment to the gate length, then the gate width is not adjusted. Both the gate width and the gate length are adjusted in some embodiments.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
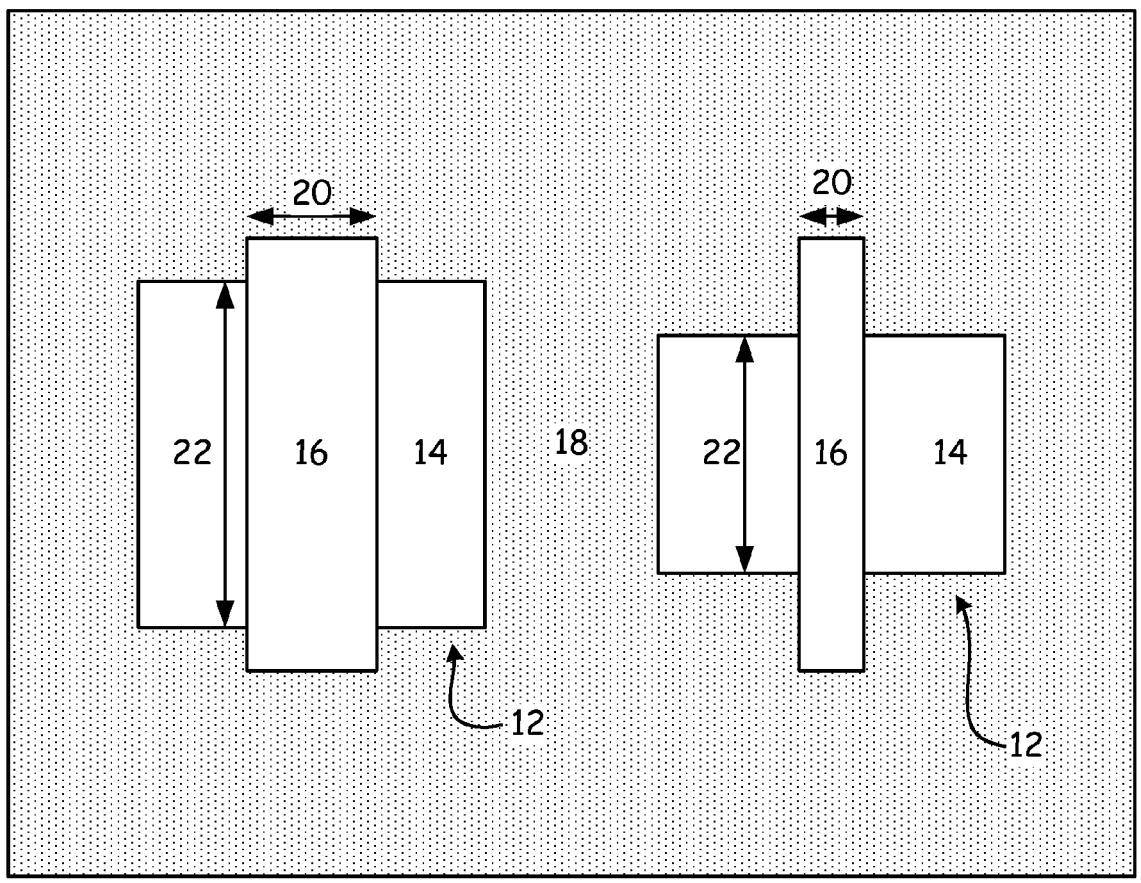
FIG. 1 is a top plan view of two transistors in an integrated circuit, where the transistors have different gate lengths and gate widths.

The inventors have advantageously discovered that the ratios of (1) active semiconducting surface area, such as silicon, to the total surface area within a given portion of an integrated circuit, and (2) polysilicon surface area, such as gate structures, to the total surface area within a given portion of an integrated circuit is a means by which the variability of certain properties of the transistors within that portion of the integrated circuit can be predicted and compensated for. These ratios are individually referred to herein as the active density and the polysilicon density, respectively, which are generally referred to herein as characteristic densities.

The characteristic densities can be determined for a portion of the integrated circuit that is either very small, in the range of tenths of a micron square, or very large, such as the entire size of the integrated circuit, which is also called the chip size or die size. In other words, a given integrated circuit can have many different portions, each with its own calculated characteristic densities, or it can be one large portion, with a single set of relative densities for the entire integrated circuit.

Further, the size of the various portions within a given integrated circuit may vary from portion to portion, with some of the portions being relatively large (such as within areas of the integrated circuit where one or both of the characteristic densities do not change very rapidly across the surface of the integrated circuit) and others of the portions being relatively small (such as within areas of the integrated circuit where one or both of the characteristic densities change more rapidly across the surface of the integrated circuit). Further, the integrated circuit can be divided into first portions to compute the active density, and divided into second portions to computer the polysilicon density, where the portions do not have the same sizes or boundaries for the two computations.

The selection of a size to use for the segmentation of the integrated circuit into portions can be determined by one or more of a variety of different factors. For example, one factor that could be used is the degree of homogeneity of the characteristic density across the surface of the integrated circuit. If the characteristic density would tend to vary widely across the surface of the integrated circuit, then it might be preferred to calculate the characteristic density individually for relatively small portions of the integrated circuit. However, if the characteristic density would not tend to vary widely across the surface of the integrated circuit, then it might be preferred to calculate the characteristic density individually for relatively large portions of the integrated circuit, or for the entire integrated circuit as a single unit.

One aspect of the present invention describes a method for determining the characteristic densities of a given portion of an integrated circuit design, and then modifying the widths and lengths of the channels of the transistors within that given portion to tune the performance of the transistors for the characteristic densities within that given portion.

FIG. 1 depicts a very basic top plan view of a portion of an integrated circuit 10, depicting parts of two individual transistors 12, with each transistor 12 having an active area 14 and a gate 16. The active areas 14 of each transistor 12 are defined between insulating areas 18, such as shallow trench isolation structures. The gates 16 of the transistors 12 are often formed of a doped and conductive polysilicon.

Many of the electrical properties of a transistor 12 are determined by the physical properties of the area of the transistor 12 that resides in the active area 14 below the gate 16, which is commonly referred to as the channel. For example, the length 20 and the width 22 of the channel plays a significant role in setting many electrical properties of the transistor 12, such as the level drain current and the saturation drain current, to just mention two. The length 20 of the channel is more or less defined by the X measurement of the polysilicon gate 16. The width 22 of the channel area is more or less defined by the Y measurement of the active area 14.

The characteristic densities of the portion of the integrated circuit 10 depicted in FIG. 1 can be determined in one or more of a number of different ways. One method is to use the design information to calculate the total surface area of the gates 16 within the desired portion, and to likewise use the design information to calculate the total surface area of the active areas 14 within the desired portion. The surface area of the active areas 14 is divided by the total surface area within the desired portion, and the surface area of the gates 16 is divided by the total surface area within the desired portion, to yield the characteristic densities.

Methods according to various embodiments of the present invention are made easier to implement by defining two parameters, called delta-length and delta-width. Delta-length is defined herein as the difference between (1) the length 20 of the channel as designed and (2) the actual length 20 of the channel as fabricated by a given process flow. Similarly, delta-width is defined herein as the difference between (1) the width 22 of the channel as designed and (2) the actual width 22 of the channel as fabricated by a given process.

As delta-length increases, the actual length 20 of the channel decreases in comparison to the designed length 20 of the channel, and the drain current through the channel increases. Drain currents in the linear and saturation regions of the channel tend to be proportional. Thus, a change in the delta-length affects the linear and saturation drain currents proportionately. As delta-width increases, the actual width 22 of the channel decreases in comparison to the designed width 22 of the channel, and the drain current through the channel decreases. Thus, a change in the delta-width also affects the linear and saturation drain currents proportionately.

The inventors have discovered that the drain current and the delta-length both increase relative to the design data in portions of the integrated circuit 10 that have a relatively lower active density, and the drain current and the delta-length both decrease relative to the design data in portions of the integrated circuit 10 that have a relatively higher active density.

If a transistor 12 has relatively higher drain currents due to a relative increase in delta-length (both relative to another portion of the integrated circuit 10, for example), then equations (1) and (2) below can be used to adjust the performance of the transistor 12 to the desired levels, by either decreasing the width 22 or increasing the length 20 of the transistor 12, either of which could be accomplished either in the design phase or the fabrication phase of the integrated circuit 10.

Equation (1) calculates the drain current in the linear region, and equation (2) calculates the drain current in the saturation region. Decreasing the width 22 during the design phase of the integrated circuit 10 tends to be a less complicated remedial method, because it avoids increasing the gate input capacitance, as calculated in equation (3). An increase in the gate capacitance or a decrease in the saturation drain current increases the propagation delay of the transistor 12, as given in equation (4).

$$Id_{lin} = Kp*(W-DW)/(L-DL)*(V_{gs}-Vt-½V_{ds})*V_{ds} \quad (1)$$

$$Id_{sat} = (Kp/n)*(W-DW)/(L-DL)*(V_{gs}-Vt)^2 \quad (2)$$

$$C_{gb} = C_{di}*(W-DW)*(L-DL) \quad (3)$$

$$\tau = R*C_{MOS} \quad (4)$$

Figure 4:
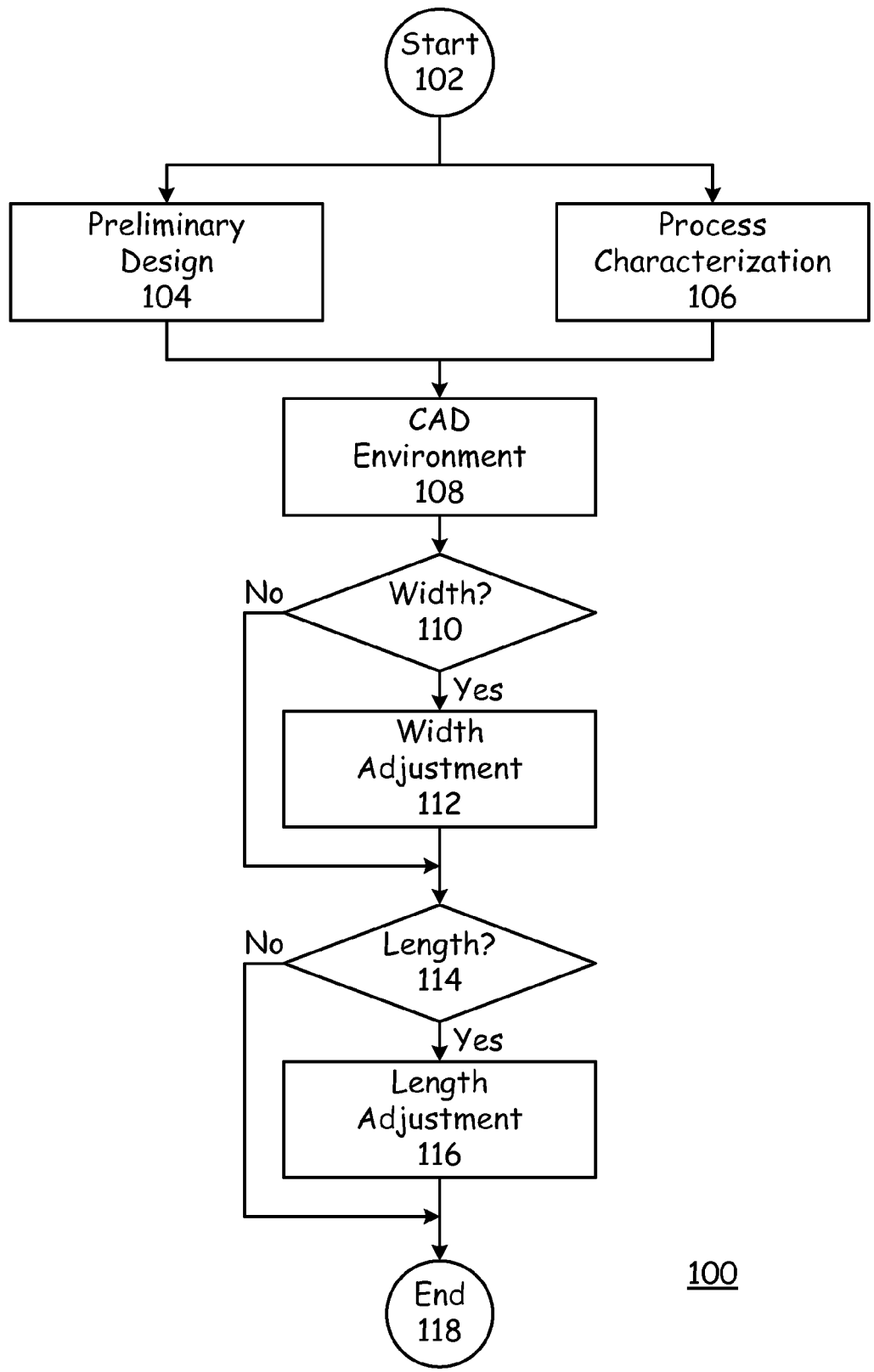
FIG. 4 is a flow chart of a method for reducing the variation of a property between transistors of an integrated circuit, according to an embodiment of the present invention.

W=design width
L=design length
DW=delta width
DL=delta length
Id=drain current
Kp=transconductance parameter=$\mu_0*C_{ox}$
$\mu_0$=channel carrier mobility
$C_{di}$=oxide capacitance/unit area=$E_0*E_{di}/T_{di}$.
$E_0$=free space permittivity
$E_{di}$=dielectric permittivity
$T_{di}$=gate dielectric thickness
Vt=threshold voltage $V_{gs}$=gate terminal voltage with respect to the source terminal $V_{ds}$=drain terminal voltage with respect to the source terminal n=technology dependent factor, approximately equal to two τ=propagation delay R=channel resistance=Vd/Idsat One general method 100 according to an embodiment of the present invention is now given, with reference to FIG. 4. It is appreciated that variations in the method are contemplated, and that the invention is not strictly limited to the steps or order of the steps as described in the example that follows.

The method starts as given in block 102, where two steps of the method 104 and 106 can be performed in any order or in tandem. In one step, the design of the integrated circuit is created such that there is room to size at least one of the width 22 and the length 20 of the channel, as given in block 104.

Figure 2:
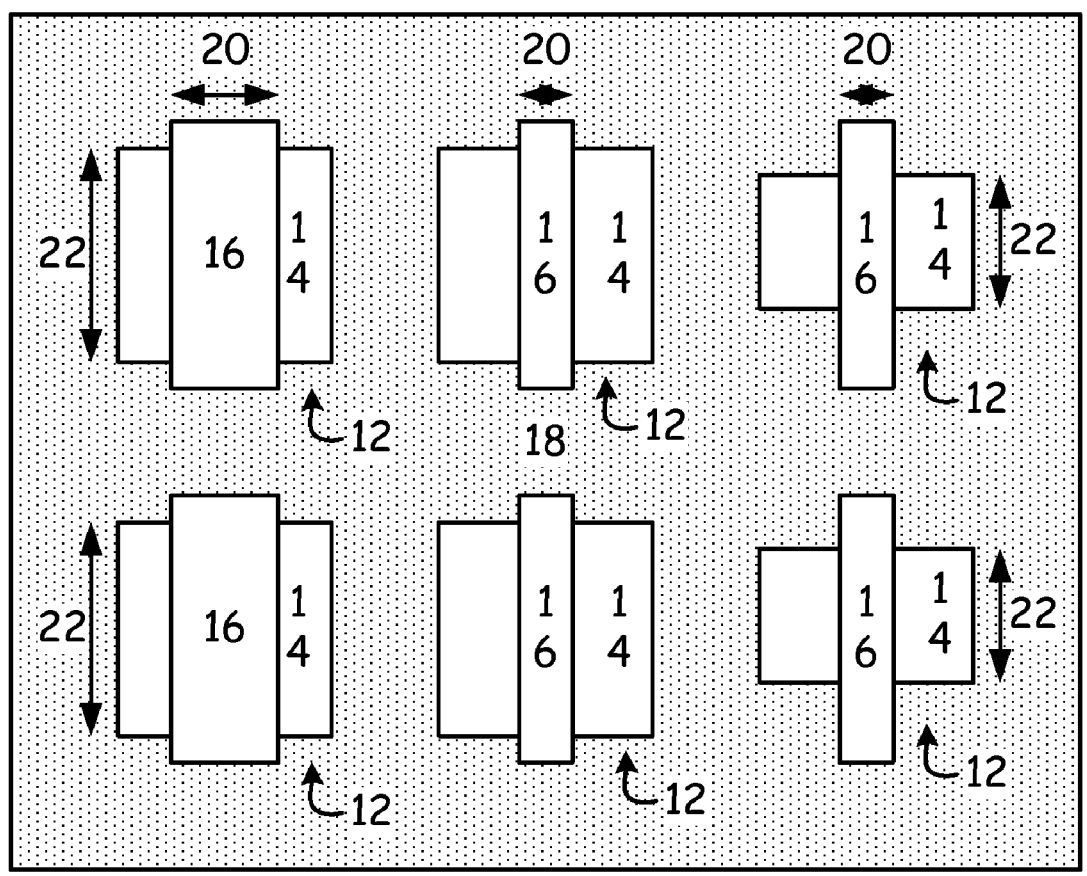
FIG. 2 is a top plan view of a first test circuit, depicting transistors in a portion of an integrated circuit, where the transistors have different gate lengths and gate widths, and the portion has a first active density and a first polysilicon density.
Figure 3:
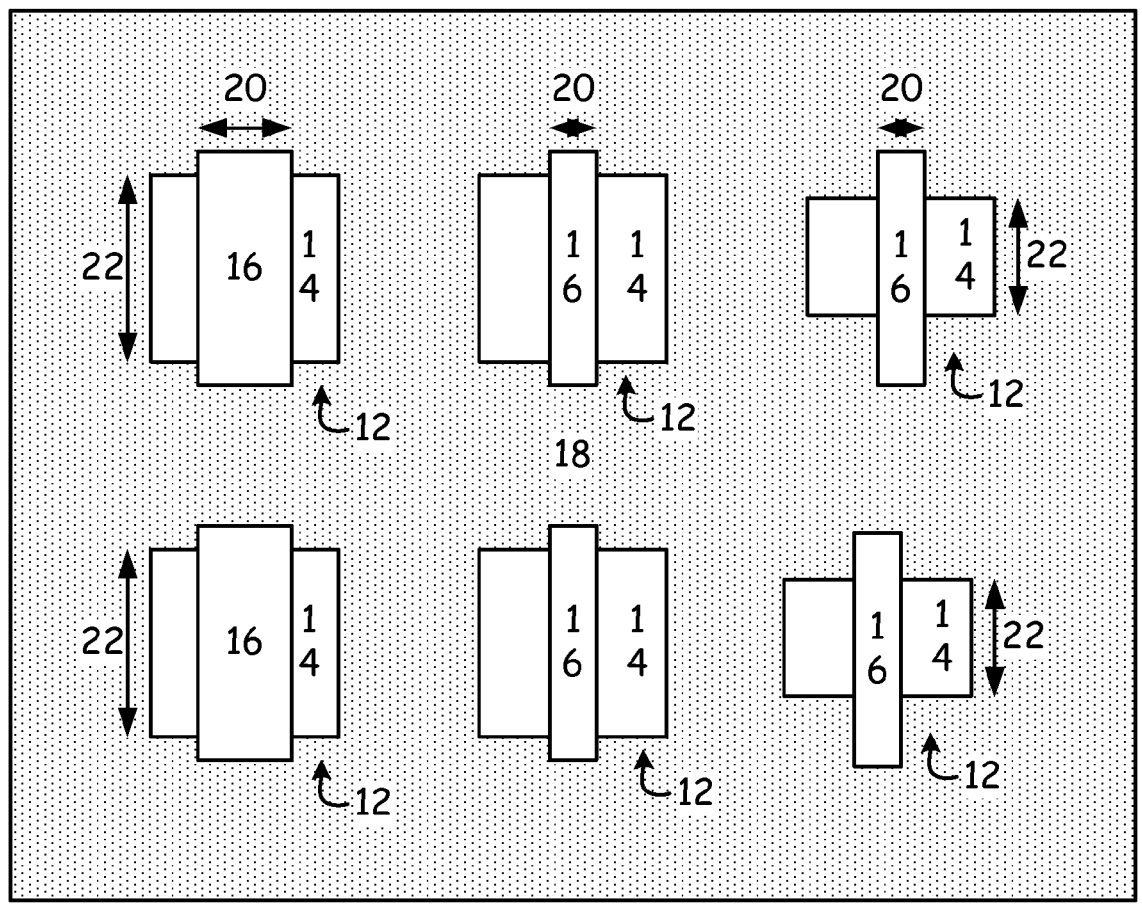
FIG. 3 is a top plan view of a second test circuit, depicting transistors in a portion of an integrated circuit, where the transistors have different gate lengths and gate widths, and the portion has a second active density and a second polysilicon density.

In block 106, the affect of the characteristic densities on the performance of the transistor 10 is characterized. This is accomplished such as by creating test structures, as depicted in FIGS. 2 and 3, where at least two of the transistors 12 have the same channel lengths 20 but with different channel widths 22 (to determine width effects), and at least two of the transistors 12 have different channel lengths 20 but the same channel widths 22 (to determine length effects). The transistor 12 sets are replicated inside of large regions of different characteristic densities. For example, FIG. 2 depicts a relatively larger active density and larger polysilicon density than FIG. 3. The sizes of the transistors 12 in the test structures are selected in a manner that enhances the desired effect, by reducing other local geometric effects that are well known and defined in the design rules. These designs are fabricated in test wafers through the production processes that are to be characterized.

Once the test structures are completed, the values of delta-length and delta-width are determined for the various regions of different characteristic density, by measuring the current densities of the different transistors 12 pairs within a given region and solving equation (1) for delta-length and delta-width. In this manner, a model of the change in channel width 22 and length 20 with characteristic density can be established (as based on drain current). Further, similarly constructed models for saturation current density (equation 2), threshold voltage, delta-width, and delta-length can be applied to the layout of production transistors 12 during the design verification phase of the integrated circuit 10, to produce integrated circuits 10 with the desired properties.

Specific integrated circuits 12 within defined portions of the integrated circuit 10 are analyzed in the CAD environment, as given in block 108, to determine whether one or more of width adjustment and length adjustment of the channel is either possible or desirable. Because width adjustment is typically preferable to length adjustment, a decision is made as given block 110 whether to perform width adjustment, as given in block 112. For example, drain current saturation can be reduced by reducing the width of the transistor 12.

If width adjustment cannot be performed, or even if it might be desirable to also have some amount of length adjustment in addition to some amount of width adjustment, then a decision is made as given in block 114 as to whether length adjustment can be performed. If length adjustment is both desirable and possible, then length adjustment of the design is performed as given in block 116, after which the process ends, as given in block 118.

In other words, the dimensions of a given transistor 12 are adjusted in the design phase, based on the characteristic densities in the region of the transistor 12, so that the transistor 12 as fabricated has the desired properties. In this manner, the so-called on-chip variation in integrated circuit 10 performance can be reduced and perhaps eliminated.

The sequence to characterize the size of the transistor 12 is further described below.

1. Preliminary Design (as Given in Block 104)
    a. Design the integrated circuit with some amount of extra space so that gates and active areas can be sized without violating the design rules.
    b. Lay out the integrated circuit.

2. Process Characterization (as Given in Block 106)
    a. Lay out test transistors having (1) fixed width and varied length and (2) varied width and fixed length, in a matrix of regions having different characteristic densities.
    b. Run the test transistors through the fabrication process.
    c. Measure electrical properties of the test transistors.
    d. Determine delta-length and delta-width for each region of different characteristic density.
    e. Derive equations (models) that relate delta-width, delta-length, threshold voltage, and length-width interactions to the characteristic densities.

3. Logical Operations in the CAD Environment (as Given in Block 108)
    a. Define an operation to create portions in the integrated circuit.
    b. Define an operation to measure the length of a given transistor within the portion.
    c. Define an operation to determine whether the length of the transistor is drawn at the minimum length (whether length adjustment is possible).
    d. Define an operation to determine whether the given transistor is drawn at:
        i. minimum gate to active spacing,
        ii. minimum gate to gate spacing, and
        iii. minimum gate to contact feature spacing.
    e. Define an operation to determine the polysilicon density of the portion.
    f. Define an operation to measure the width of the given transistor.
    g. Define an operation to determine whether the width of the transistor is drawn at the minimum width (whether width adjustment is possible).
    h. Define an operation to determine whether the given transistor is drawn at:
        i. minimum active to active spacing, and
        ii. minimum active to contact feature spacing.
    i. Define an operation to determine the active density of the portion.

4. Width Sizing Algorithm (Active Sizing as Given in Block 112)
    a. Determine whether sizing the channel width by adjusting the active width will violate any design rules for a given transistor.
    b. Read the polysilicon density of the portion containing the given transistor.
    c. Read the active density of the portion containing the given transistor.
    d. Apply the appropriate sizing model to adjust the channel width, based on the characteristic densities.

5. Length Sizing Algorithm (Polysilicon Gate Sizing as Given in Block 116)

a. Determine whether sizing the channel length by adjusting the polysilicon gate length will violate any design rules for a given transistor.
b. Read the polysilicon density of the portion containing the given transistor.
c. Read the active density of the portion containing the given transistor.
d. Apply the appropriate sizing model to adjust the channel length, based on the characteristic densities.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A processor-based method for reducing variation in a desired property between transistors in an integrated circuit that is fabricated with a given process, the method comprising the steps of:
    using the processor, characterizing the given process to form a mathematical model that,
        associates changes in polysilicon density and active density in a design for the integrate circuit with changes in gate length and gate width in the transistors, and
        associates changes in the gate length and the gate width to the desired property,
    laying out the integrated circuit design with space sufficient to adjust the gate length and the gate width of the transistors without violating design rules of the transistors,
    dividing the integrated circuit design into virtual portions,
    for at least a given one of the portions of the integrated circuit design, measuring the polysilicon density and the active density of the portion,
    determining whether an adjustment to at least one of the gate length and the gate width will reduce variation in the desired property between the transistors in the portion of the integrated circuit design,
    using the processor, for at least one of the transistors in the given portion of the integrated circuit design, selectively adjusting at least one of the gate length and the gate width of the transistor according to the mathematical model based on at least one of the polysilicon density and the active density of the portion, to reduce variation in the desired property between the transistors in the integrated circuit design, and
    fixing the integrated circuit design into a non-transitory medium.

2. The method of claim 1, wherein the desired property of the transistors are electrical properties.

3. The method of claim 1, wherein the desired property of the transistors include at least one of current density and voltage threshold.

4. The method of claim 1, wherein the polysilicon density and the active density are measured for all portions of the integrated circuit.

5. The method of claim 1, wherein at least one of the gate length and the gate width is adjusted for all of the transistors in the at least one portion.

6. The method of claim 1, wherein the gate width is adjusted before adjusting the gate length, and if the variation is reduced to a desired degree by the adjustment to the gate width, then the gate length is not adjusted.

7. The method of claim 1, wherein the gate width is adjusted if the adjustment does not violate the design rules.

8. The method of claim 1, wherein the gate length is adjusted before adjusting the gate width, and if the variation is reduced to a desired degree by the adjustment to the gate length, then the gate width is not adjusted.

9. The method of claim 1, wherein the gate length is adjusted if the adjustment does not violate the design rules.

10. The method of claim 1, wherein both the gate width and the gate length are adjusted.

11. A processor-based method for reducing variation in desired electrical properties between transistors in an integrated circuit that is fabricated with a given process, the method comprising the steps of:
    using the processor, characterizing the given process to form a mathematical model that,
        associates changes in polysilicon density and active density in a design for the integrate circuit with changes in gate length and gate width in the transistors, and
        associates changes in the gate length and the gate width to the desired electrical properties,
    laying out the integrated circuit design with space sufficient to adjust the gate length and the gate width of the transistors without violating design rules of the transistors,
    dividing the integrated circuit design into virtual portions,
    for at least one of the portions of the integrated circuit design, measuring the polysilicon density and the active density of the portion,
    determining whether an adjustment to at least one of the gate length and the gate width will reduce variation in the desired property between the transistors in the portion of the integrated circuit design,
    using the processor, for at least one of the transistors in each portion of the integrated circuit design, selectively adjusting at least one of the gate length and the gate width of the transistor according to the mathematical model based on at least one of the polysilicon density and the active density of the portion, to reduce variation in the desired property between the transistors in the integrated circuit design, wherein
    if an adjustment to the gate width does not violate the design rules, then the gate width is adjusted before adjusting the gate length, and if the variation is reduced to a desired degree by the adjustment to the gate width, then the gate length is not adjusted, and
    fixing the integrated circuit design into a non-transitory medium.

12. The method of claim 11, wherein the desired electrical properties of the transistors include at least one of current density and voltage threshold.

13. The method of claim 11, wherein the polysilicon density and the active density are measured for all portions of the integrated circuit.

14. The method of claim 11, wherein at least one of the gate length and the gate width is adjusted for all of the transistors in the at least one portion.

15. The method of claim 11, wherein the gate length is only adjusted if the adjustment does not violate the design rules.

16. The method of claim 11, wherein both the gate width and the gate length are adjusted if the adjustment does not violate the design rules.

17. A processor-based method for reducing variation in desired electrical properties, including at least one of current density and voltage threshold, between transistors in an integrated circuit that is fabricated with a given process, the method comprising the steps of:

using the processor, characterizing the given process to form a mathematical model that, associates changes in polysilicon density and active density in a design for the integrate circuit with changes in gate length and gate width in the transistors, and associates changes in the gate length and the gate width to the desired electrical properties, laying out the integrated circuit design with space sufficient to adjust the gate length and the gate width of the transistors without violating design rules of the transistors, dividing the integrated circuit design into virtual portions, for at least one of the portions of the integrated circuit design, measuring the polysilicon density and the active density of the portion, determining whether an adjustment to at least one of the gate length and the gate width will reduce variation in the desired property between the transistors in the portion of the integrated circuit design, using the processor, for at least one of the transistors in each portion of the integrated circuit design, selectively adjusting at least one of the gate length and the gate width of the transistor according to the mathematical model based on at least one of the polysilicon density and the active density of the portion, to reduce variation in the desired property between the transistors in the integrated circuit design, wherein if an adjustment to the gate width does not violate the design rules, then the gate width is adjusted before adjusting the gate length, and if the variation is reduced to a desired degree by the adjustment to the gate width, then the gate length is not adjusted, and the gate length is only adjusted if the adjustment does not violate the design rules, and fixing the integrated circuit design into a non-transitory medium.

18. The method of claim 17, wherein the polysilicon density and the active density are measured for all portions of the integrated circuit.

19. The method of claim 17, wherein at least one of the gate length and the gate width is adjusted for all of the transistors in the at least one portion.

20. The method of claim 17, wherein both the gate width and the gate length are adjusted.

* * * * *